United States Patent [19]

Ziegler et al.

[11] 4,031,609

[45] June 28, 1977

[54] METHOD FOR THE MANUFACTURE OF A SUPERCONDUCTOR WITH A SUPERCONDUCTIVE INTERMETALLIC COMPOUND CONSISTING OF AT LEAST TWO ELEMENTS

[75] Inventors: Günther Ziegler; Sigrun Frohmader, both of Erlangen, Germany

[73] Assignee: Siemens Aktiengesellschaft, Munich, Germany

[22] Filed: June 12, 1975

[21] Appl. No.: 586,164

[30] Foreign Application Priority Data

June 14, 1974 Germany .......................... 2428817

[52] U.S. Cl. .................................................. 29/599

[51] Int. Cl.$^2$ ........................................ H01V 11/00

[58] Field of Search ....................................... 29/599

[56] References Cited

UNITED STATES PATENTS

| | | | |
|---|---|---|---|
| 3,268,362 | 8/1966 | Hanak et al. | 29/599 UX |
| 3,281,738 | 10/1966 | Hanak | 29/599 UX |
| 3,397,084 | 8/1968 | Krieglstein | 29/599 UX |
| 3,425,825 | 2/1969 | Wilhelm | 29/599 UX |
| 3,449,092 | 6/1969 | Hammond | 29/599 UX |
| 3,525,637 | 8/1970 | Kim | 29/599 UX |
| 3,578,496 | 5/1971 | Ziegler et al. | 29/599 UX |
| 3,595,693 | 7/1971 | Cecil et al. | 29/599 UX |
| 3,728,165 | 4/1973 | Howlett | 29/599 UX |
| 3,829,963 | 8/1974 | McDougall et al. | 29/599 UX |
| 3,838,503 | 10/1974 | Suenaga et al. | 29/599 UX |

*Primary Examiner*—C.W. Lanham
*Assistant Examiner*—V. K. Rising
*Attorney, Agent, or Firm*—Kenyon & Kenyon, Reilly, Carr & Chapin

[57] ABSTRACT

A method for the manufacture of a superconductor with a superconductive intermetallic compound consisting of at least two chemical elements in which one ductile structural part made of at least one element of the compound is brought into contact with a second structural part which contains a ductile carrier metal for the remaining elements of the compound whereafter the remaining elements of the compound are supplied to the second ductile structural part through decomposition of their alkyl compounds at elevated temperature and the compound is formed through a heat treatment. The superconductors produced in this manner are particularly well suited for superconducting magnet coils.

12 Claims, 3 Drawing Figures

METHOD FOR THE MANUFACTURE OF A SUPERCONDUCTOR WITH A SUPERCONDUCTIVE INTERMETALLIC COMPOUND CONSISTING OF AT LEAST TWO ELEMENTS

BACKGROUND OF THE INVENTION:

The invention relates to a method for the manufacture of a superconductor with a superconductive intermetallic compound consisting of at least two chemical elements in general and more particularly to such a method wherein a ductile structural part made of at least one element of the compound is brought into contact with a second structural part which contains a carrier metal for the remaining elements of the compound; the remaining elements of the compound are subsequently admitted to the second ductile structural part at elevated temperature; and the compound is formed by a reaction of its remaining elements, which diffuse through the second structural part, with the first structural part.

Superconductive intermetallic compounds of the type $A_3B$, consisting of two chemical elements, for example, $Nb_3Sn$ or $V_3Ga$, which have an A-15 crystal structure exhibit very good superconductor properties being particularly distinguished by a high critical magnetic field, a high transition temperature and a high critical current density. As a result, they are particularly well suited as superconductors for superconducting coils used to generate strong magnetic fields such as are needed for research purposes. Other possible applications include superconducting magnets for the suspension guidance of magnetic suspension railroads and the windings of electric machines. Recently, ternary compounds such as niobium-aluminum-germanium ($Nb_3Al_{0.8}Ge_{0.2}$) have also become of special interest. However, since these compounds are very brittle, their manufacture in a form suitable, for example, for use in magnet coils presents considerable difficulties. Several methods of manufacturing superconductors in the form of long wires or ribbons with, in particular, two-component intermetallic compounds have been disclosed. These methods are used particularly for the manufacture of what are known as multi-core conductors. Such conductors have wires, typically of $Nb_3Sn$ or $V_3Ga$, arranged in a normal-conducting matrix. In the known methods, a ductile chemical element, in wire form, of the compound to be prepared, e.g., a niobium or vanadium wire, is surrounded with a sleeve of an alloy containing a ductile carrier metal and the remaining elements of the compound, e.g., a copper-tin alloy or a copper-gallium alloy. In particular, a multiplicity of such wires are embedded in a matrix of the alloy. The structure so obtained is then subjected to cross-section reducing processing to obtain a long wire such as is required for coils. As a result the diameter of the wires, e.g. niobium or vanadium wire, for example, is reduced to a small value in the order of magnitude of about 30 to 50 $\mu$m or even less, which is desirable in view of the superconduction properties of the conductor. Through the crosssection reducing processing attempts are also made to obtain the best possible metallurgical bond between the wire and the surrounding matrix material of the alloy without, however, the occurrence of reactions which lead to embrittlement of the conductor. After the cross-section reducing processing, the conductor, consisting of one or more wires and the surrounding matrix material, is subjected to a heat treatment such that the desired compound is formed by a reaction of the wire material, i.e., the niobium or vanadium, for instance, with the further element, contained in the surrounding matrix, of the compound, e.g., tin or gallium. In this process, the element contained in the matrix diffuses into the wire material, which consists of the other element of the compound, and reacts therewith forming a layer consisting of the desired compound. (See United Kingdom Patent Specification No. 1,280,583 and 1,335,447; U.S. Pat. No. 3,728,165).

However, these known methods are not fully satisfactory for a number of reasons. First, the diffusion process in these methods cannot be carried out so that all the gallium or tin present in the matrix is used up to form the intermetallic compound. It is therefore not possible to build up $V_3Ga$ or $Nb_3Sn$ layers of any desired thickness. Rather, the diffusion of gallium or tin toward the vanadium or niobium cores will terminate when the activity of the elements gallium and tin in the copper matrix is equal to their activity in the intermetallic compounds $V_3Ga$ or $Nb_3Sn$ produced. In other words, no further $V_3Ga$ or $Nb_3Sn$ will be formed when the concentration of the gallium or the tin in the copper matrix has dropped to a given value because of the inward diffusion of gallium or tin into the cores. If, for instance, gallium is diffused from a copper-gallium matrix with 18 atom percent of gallium into vanadium cores at a temperature of about 700° C, the equilibrium state mentioned, at which no further formation of $V_3Ga$ takes place, is reached when the gallium content of the matrix has dropped to about 12 atom percent. This means that only about 38% of the gallium available in the matrix is converted into $V_3Ga$. The thickness of the $Nb_3Sn$ or $V_3Ga$ layers formed in a multi-core conductor depends therefore not only on the annealing time, the annealing temperature and the composition of the copper-gallium or the copper-tin alloy, but also on the total amount of tin or gallium available for each core, i.e., on the volume of the part of the matrix available for each individual core.

However, in order to obtain a high effective critical current density, i.e., a high critical current density referred to the total conductor cross section, it is necessary that the greatest possible layer thickness of the intermetallic compound to be produced. With the known methods described above this can be achieved only by making the ratio of the matrix share to the core share of the total cross section area of the conductor such that the growth of the layer is not limited by a limited supply of gallium or tin, i.e., a core spacing as large as possible is necessary. However, in a multi-core conductor of given cross section this requirement can be met only by either drawing out the core, for a fixed number of cores, to a very thin size during the cross-section reducing process steps, or by reducing the number of cores, if the core cross section is fixed. Neither solution is very satisfactory since, on the one hand, the drawing of the cores into extremely thin filaments presents considerable difficulties and is expensive and, on the other hand, if the number of cores is reduced, the effective current density decreases and, as a rule, is only just compensated by the thicker diffusion layers which can possibly be obtained. An arbitrary increase of the core spacings, finally, is also not possible for reasons of forming technology. For instance, if a larger number of vanadium or niobium cores is to be drawn to a uniform thinness so that their cross sections remain equal, then the core spacing must not be too great.

A further difficulty with the known methods is that the matrix material containing the embedded cores, consisting of the carrier metal and the remaining elements of the compound to be produced, is relatively difficult to deform, particularly for higher concentrations of these elements. These matrix materials have, in particular, harden quickly through crosssection reducing cold working and can then be deformed further only with great difficulty. It is therefore necessary in these methods to subject the conductor structure consisting of the cores and the matrix material to intermediate anneals for recovery and recrystallization of the matrix structure which has become brittle during the cold-working even after relatively small deformation steps. Although these annealing treatments can be performed at temperatures and annealing times at which, as a rule, is below that at which the superconductive compound to be produced is formed, they are very time consuming because of their frequent repetition. This increasingly difficulty in deforming the matrix material with increasing content of the remaining elements of the compound to be produced is, finally, also a reason why the concentration of, for instance, gallium or tin cannot simply be increased arbitrarily in the matrix in order to obtain heavier layers of the compound to be produced. Furthermore, with increasing concentration of these elements, the melting point of the matrix material drops. For very high concentrations, this leads to problems in the heat treatment for forming the intermetallic compound. Furthermore, if the concentration is too high these elements can form undesirable intermetallic phases with the carrier metal.

Proposed methods are also known in which the repeated intermediate anneals mentioned are eliminated. In these methods one or more cores of a ductile element of the compound to be produced, particularly niobium or vanadium, are embedded in a ductile matrix material, e.g., copper silver or nickel, which contains, at most, only very small amounts of the element of the compound to be produced. The structure consisting of the cores and this matrix material can then be processed without any intermediate anneal by a cross-section reducing process, e.g., by cold-drawing, into a thin wire which contains very thin cores of vanadium or niobium. After the last cross-section reducing process step, the remaining elements of the compound to be produced, e.g., tin in the case of $Nb_3Sn$, are then applied to the matrix material. This is done by briefly immersing the wire in a tin melt, so that a thin tin layer is formed on the matrix material, or by evaporating a tin layer on the matrix material. Subsequently, a heat treatment is performed, in which the elements of the compound to be produced, which have been applied to the matrix material, are first diffused into the matrix material and even through it, and then form the desired superconductive compound through reaction with the cores (see "Applied Physics Letters" Vol. 20 (1972), pages 443 to 445; U.S. Pat. No. 3,829,963).

However, only relatively small amounts of an element such as tin can be applied to the matrix which, for instance, consists of copper, since in applying larger amounts of tin an undesirable, brittle intermediate phase of copper and tin can readily form at the temperature necessary for diffusing the tin into the copper matrix. After excessive amounts of tin have been diffused into the matrix, the tin itself or a surface area of the matrix can melt and in the process can easily drip or run off from the matrix surface. Therefore, in this method also, only a limited amount of the lower melting temperature element, e.g., tin, is available for the formation of the desired intermetallic compound, e.g., $Nb_3Sn$. In U.S. Pat. No. 3,829,963, it is suggested that, if desired, all the niobium contained in the copper matrix can also be converted into $Nb_3Sn$, if the individual process steps for coating the matrix with tin are repeated often enough to obtain the subsequent formation and homogenization of the copper-tin matrix and for reacting the tin contained in the matrix with the niobium core. However, such a method is extremely expensive because of the large number of process steps required.

In U.S. Pat. No. 3,829,963, a continuous method for the manufacture of $Nb_3Sn$ multi-core conductors, in which a conductor structure in wire form, consisting of a copper matrix and embedded niobium cores, is continuously conducted through an oven, in which several containers with melted tin are arranged side by side is also described. The parts of the interior of the oven located above the respective containers are traversed by the conductor structure sequentially. The first tin melt, through whose associated vapor space the conductor structure first runs, is at a temperature of 1500° C, and the other tin melts, through whose vapor spaces the conductor structure runs subsequently, are at a temperature of 1000° C. The conductor itself is kept at a temperature of 850° C by the oven. As described in the U.S. Pat. No. 3,829,963, the tin vapor pressure in the vapor space above the first tin melt which is at a temperature of 1500° C, must be high enough so that the transfer and deposition rate of the tin exceeds the solid diffusion rate of the tin into the copper matrix to cause a tin concentration gradient to build up rapidly transversely across the wire radius. The conductor structure in wire form is kept over the tin melt of higher temperature until sufficient tin for the formation of the desired mean matrix composition is applied. As also stated in U.S. Pat. No. 3,829,963, the tin vapor pressure in the vapor spaces above the tin melts which are at a temperature of 1000° C, through which the conductor structure runs subsequently, must be just large enough so that the tin supply rate is reduced to a value at which tin diffuses through the copper matrix and arrives through solid diffusion at the surface of the niobium cores. The solid diffusion itself takes place at a temperature of 850° C. This temperature is chosen considerably lower than the temperature of the tin melts in order to prevent re-evaporation of the tin from the matrix and melting of the matrix. This method is also extremely expensive because of the three different temperatures required for the tin melts and the conductor structure itself, all of which must be maintained accurately during the relatively laborious process. Furthermore, the temperatures of 1500° and 1000° C, respectively, required for the tin melts, are uncomfortably high with regard to the stresses of the container material that occur. In addition, it is difficult to reproducibly achieve a desired, given concentration of tin in the copper matrix in the vapor space above a tin melt.

SUMMARY OF THE INVENTION:

It is an object of the present invention to further improve the manufacture of a superconductor with a superconductive intermetallic compound consisting of at least two chemical elements in which a ductile structural part made of at least one element of the compound is brought into contact with a second structural part which contains a ductile carrier metal for the remaining elements of the compound; the remaining elements of the compound are subsequently supplied to the second ductile structural part at elevated temperature; and the compound is formed by a reaction of the remaining elements, diffusing through the second structural part, with the first structural part. In particular, it is the object of the present invention to further simplify the method by simultaneously lowering the temperatures required while increasing its reproducibility, without the occurrence of a limitation of the layer thickness of the superconductive intermetallic compound to be produced.

According to the present invention, these objects are achieved by supplying the remaining elements to the second ductile component through decomposition of alkyl compounds of these elements.

The method according to the present invention has a number of advantages over the known methods. First, no temperatures which appreciably exceed the temperatures required for the formation of the superconductive intermetallic compound itself are required for the decomposition of alkyl compounds of the remaining elements and for supplying these elements to the second ductile component. Through decomposition of the alkyl compounds which are easy to handle, predetermined amounts of the remaining elements of the compound to be produced can furthermore be fed to the second ductile component of the conductor structure to be treated in a simple and highly reproducible manner.

The method according to the present invention is suitable for the manufacture of superconducting structures of different forms as long as they have a layer of a superconductive intermetallic compound consisting of at least two elements or consist entirely of such a compound.

However, the method is used preferably for the manufacture of multi-core conductors. For this purpose, several cores made of the first element and forming the first structural part can advantageously be first embedded in a matrix material containing a ductile carrier element for the remaining elements of the compound and forming the second structural part and, together with the latter, processed in a cross section-reducing manner. After the last cross section-reducing process step, the conductor structure so obtained is then heated and brought into contact with the alkyl compounds of the remaining elements.

The method according to the present invention is particularly well suited for the manufacture of a superconductor with a compound, consisting of two elements, of the type $A_3B$ with A-15 crystal structure. In the manufacture of such compounds, the first structural part consists of the higher melting point element of the compound, while the lower melting point element is supplied through the decomposition of the alkyl compounds.

Particularly good cold workability of the conductor structure consisting of the first and the second structural parts is obtained if the second structural part consists only of the carrier metal for the remaining elements of the compound to be produced. In such a case, the entire amount of the remaining elements required must then be supplied through decomposition of alkyl compounds. This can take relatively long, particularly if larger quantities of the remaining elements must be supplied for forming thick layers of the intermetallic compound to be produced. The required reaction times can be shortened if the second structural part also contains a share of the remaining elements of the compound to be produced along with the carrier metal.

Copper is particularly well suited as the ductile carrier metal of the second structural part. Silver or a ductile alloy of copper and silver as well as other ductile elements which permit sufficient diffusion of the remaining elements toward the first structural part and do not react in an interfering manner with the elements of the compound to be produced can also be used.

Particularly if an electrically highly conductive metal such as copper is used as the carrier metal for the second structural part, further advantages in addition to the aforementioned shortening of the reaction times are obtained if the second structural part also contains, in addition to the carrier metal, a share of the remaining elements of the compound to be produced. For, the remaining elements increase the electric resistance of the matrix material so that the conductor structure to be treated can be heated for decomposing the alkyl compounds in a simple and advantageous manner by direct passage of current. The second structural part in such a case should contain at least enough of remaining elements that its electric resistance is increased by at least a factor of 100 over the pure carrier metal. If good cold workability of the second structural part is desired, however, the share of the remaining elements should only be high enough so that the second structural part can be cold worked without intermediate anneals.

The method according to the invention is extremely well suited for the manufacture of superconductors with the intermetallic compound $Nb_3Sn$. For the manufacture of a superconductor with this compound a conductor structure whose first structural part consists of a niobium rod and whose second structural part consists of copper with about 1 to 4 atom-percent of tin is first produced. Even with a tin content of only 1 atom-percent the specific electric resistance of the copper-tin matrix, which for a pure copper matrix would be about $10^{-8}$ ohm.cm, is increased to about $10^{-5}$ ohm.cm. Such a conductor structure can be heated in a simple manner through the direct passage of current. On the other hand, a copper-tin matrix with a tin content of up to 4 atom-percent can still be cold worked without the need for intermediate anneals. Tin tetraethyl is preferably used as an alkyl compound in the manufacture of $Nb_3Sn$. The conductor structure itself is heated to a temperature of about 650 to 800° C for decomposing the tin tetraethyl. Although tin tetraethyl would decompose at considerably lower temperatures, these high temperatures are preferred in order to achieve rapid diffusion of the tin obtained in the decomposition into the copper-tin matrix. Surprisingly, no carbon contamination occurs at the treated conductor structure even at such high decomposition temperatures.

In principle, the decomposition of the alkyl compounds can be performed and continued at a temperature above the formation temperature of the intermetallic compound to be produced, until the desired layer thickness of the compound to be produced is reached. The times required therefor, during which the conductor structure to be treated would have to be brought into contact with the alkyl compound, are as a rule, however, too long where the remaining elements of the compound to be produced are supplied to the conductor structure in a continuous process. In this and similar cases it is therefore advisable to perform an additional heat treatment in an inert atmosphere for forming the intermetallic compound after the remaining elements are supplied through decomposition of the alkyl compounds. In the production of $Nb_3Sn$, this heat treatment can preferably be performed at a temperature of between about 740 and 850° C and last at least 10 hours.

DETAILED DESCRIPTION OF THE PRESENT INVENTION

Figure 1:
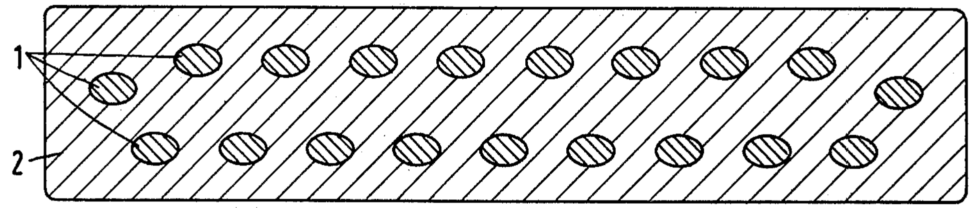
FIGS. 1 and 2 are schematic cross sections of a conductor structure for a multi-core conductor to be manufactured according to the present invention, before and after the formation of the intermetallic compound.

For fabricating a $Nb_3Sn$ multi-core conductor, a conductor structure of the type shown in FIG. 1 was first prepared by first placing a niobium rod into a tube of a copper-tin alloy with about 2.2 atom-percent of tin, and the remainder copper, and then drawing this rod, without intermediate anneal, into a long wire. Nineteen pieces of this ling wire were then combined in a bundle and again placed in a tube of the same copper-tin alloy. The structure obtained in this manner was then cold drawn or cold rolled until a conductor structure of the form shown in FIG. 1 was obtained, in which each of the 19 individual niobium cores 1 has a major diameter of about 50 $\mu$m and a minor diameter of about 25 $\mu$m and the cross-sectional area of the copper-tin matrix 2 was about 190 $\mu$m × 540 $\mu$m.

Figure 3:
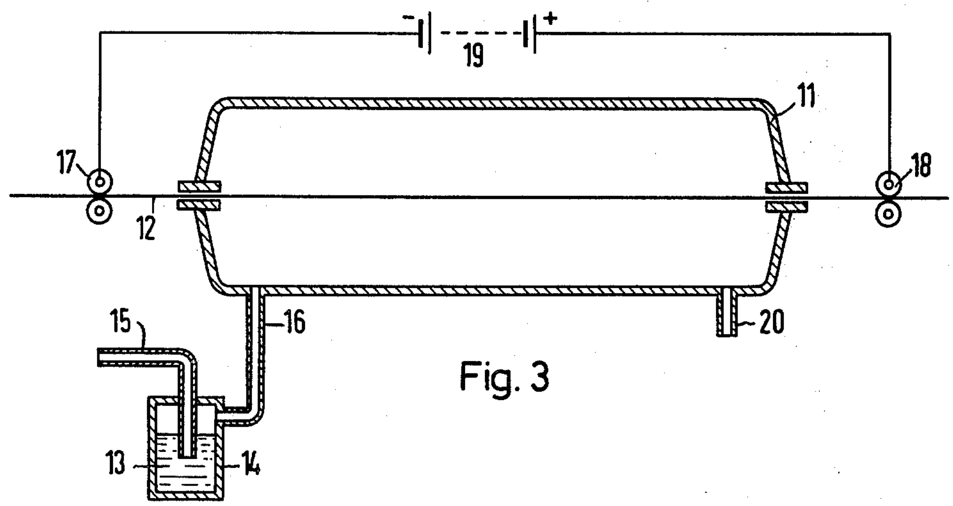
FIG. 3 is a schematic illustration of an apparatus for carrying out the method according to the invention.

Further tin was then supplied to the copper-tin matrix of this conductor structure prepared in this manner using the apparatus shown in FIG. 3. This apparatus consists essentially of a reaction tube 11, e.g., a quartz tube, through which the conductor structure 12 can be pulled. A supply 13 of tin tetraethyl is provided in a supply vessel 14. Into this supply vessel 14, inert gas can be introduced via a nozzle 15, in order to transport the tin tetraethyl through a connecting line 16 into the reaction tube 11. The conductor structure 12 is heated by the direct passage of current to a temperature at which the tin tetraethyl is decomposed and at the same time tin diffuses into the copper-tin matrix of the conductor structure. For this purpose the conductor structure 12 is led over contact rolls 17 and 18, which are connected with an electric current source 19. The gaseous decomposition products of the tin tetraethyl and the excess inert gas can flow out from the reaction tube 11 through a nozzle 20.

In order to supply further tin to the copper-tin matrix 2, the conductor structure in ribbon form shown in FIG. 1 is pulled through the approximately 1.5-m long reaction tube 11 with a velocity of about 4 to 5 m/hr and is heated in the process by the direct passage of current (about 8A) to a temperature of about 720° C. About 38 to 40 l/hr of nitrogen are conducted through the tin tetraethyl supply 13, which is kept at a temperature of about 24° C at the same time. This nitrogen transports the tin tetraethyl vapor into the reaction tube 11. The tin tetraethyl is decomposed at the hot conductor structure 12. In the process, the tin is deposited on the copper-tin matrix and diffuses into this matrix.

Figure 2:
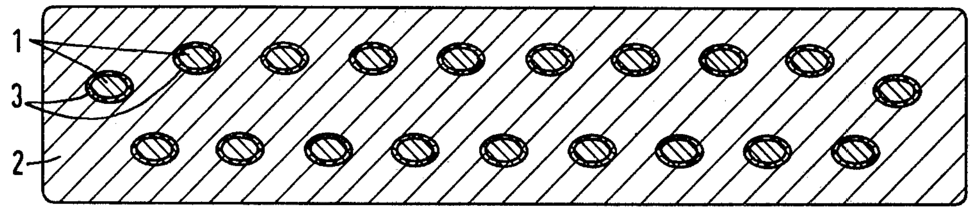

After passing through the reaction tube 11, the conductor structure 12, whose copper-tin matrix now contained about 7 atom-percent of tin, was annealed in an inert gas, e.g., argon, for about 40 to 50 hours at a temperature of about 750° C. In this anneal, tin diffused from the copper-tin matrix 2 into the niobium core 1 and reacted with the niobium, forming layers 3 of $Nb_3Sn$ about 4 to 5 $\mu$m thick, at the surface of the individual niobium cores 1 as schematically shown in FIG. 2. The effective critical current densities, i.e., the critical current densities measured over the total conductor cross section, which the conductor so produced carries at a temperature of 4.2 K in different external magnetic fields, are given in the following Table as a function of the external magnetic field measured in Teslas:

| Magnetic Field (T) | 5 | 6 | 7 | 8 | 9 | 10 | 11 |
|---|---|---|---|---|---|---|---|
| Critical Current Density $j_c$ ($10^4$ A/cm²) | 3.6 | 3.0 | 2.4 | 2.0 | 1.6 | 1.3 | 1.0 |

The measurements also showed that before these relatively high critical current densities occurred, there was practically no ohmic resistance in the conductor. Prior to reaching the critical current density, the current therefore flowed practically exclusively in the $Nb_3Sn$ layers and not in the matrix material.

The tin content of the copper matrix can be increased still further over the example by introducing larger amounts of tin tetraethyl into the reaction tube, or by extending the contact time of the conductor structure with the tin tetraethyl. If possible, however, the tin content of the copper-tin matrix should not exceed about 15 atom-percent since, at the temperatures used, undesirable brittle copper-tin phases are formed with higher tin contents. Heating of the conductor structure by the direct passage of current would be possible, in principle, even with a pure copper matrix. With the first absorption of tin, however, the electric resistance of the matrix material would be increased so much that the conductor structure would burn through. A conductor structure with a pure copper matrix is therefore not suitable in practice for heating by the direct passage of current.

In addition to its use for the manufacture $Nb_3Sn$ multi-core conductors, the method according to the present invention is also suited, for instance, for the manufacture of superconductors with $V_3Ga$ cores. For the manufacture of superconductors, a conductor structure which consists of a coppergallium matrix with about 3 atom-percent of gallium, the remainder copper, and embedded vanadium cores is an advantageous starting material. As the gallium compound, gallium trimethyl is advantageously used. The decomposition temperature can be about 600° C and the temperature for the subsequent heat treatment about 660°0 C.

The multi-core conductors which can be manufactured by the method according to the invention may, of course, also have circular cross section instead of the rectangular cross section shown in FIGS. 1 and 2. The conductor structure to be treated can also be fabricated differently from the example above. Holes in a copper-tin rod can be drilled, for example, niobium rods placed into these holes and the structure so obtained processed in a cross section-reducing manner.

The cores of the multi-core conductor, furthermore, need not consist completely of at least one ductile element of the compound, e.g., of niobium. The cores may rather also have a core of a metal, for instance, copper, which was high electric and thermal conductivity and is electrically normally conducting at the operating temperature of the superconductor and provides stabilization. Then, only a sheath enclosing this core need consist of at least one element of the compound. In addition, the multi-core conductors which can be manufactured by the method according to the invention can advantageously be twisted about their longitudinal axis before the remaining elements of the compound to be produced are supplied, so that the embedded cores of the first element of the compound to be produced and therefore, also the superconductor cores of the finished conductor, lie on helical paths in a well known manner.

The first structural part with a higher melting point element of the compound to be produced need not absolutely consist, in the method according to the invention, of a single metal, but may optionally contain additions. For instance, titanium, zirconium or tantalum in amounts of up to about 30% by weight can be admixed to the niobium or the vanadium. Additions of hafnium are also possible. Furthermore, a vanadium-niobium alloy for instance, can be used as the first component. In addition, the various remaining elements of the desired compound can be supplied to the matrix, for instance, simultaneously or sequentially through decomposition of several alkyl compounds.

As already noted, the method according to the present invention is suited not only for the manufacture of superconductors in wire form, but also for the manufacture of superconducting structures of different form. For instance, a superconducting shielding plate or a superconducting shielding cylinder with an $Nb_3Sn$ layer can be fabricated by providing a niobium sheet or a niobium cylinder with a copper or a copper-tin layer on one side and supplying tin to the arrangement so obtained at a temperature of about 720° C through decomposition of tin tetraethyl. The tin then diffuses into the copper layer and can react, in a subsequent heat treatment at about 750° C, with the niobium, forming an $Nb_3Sn$ layer. On the copper-free side of the niobium components, on the other hand, practically no reaction of niobium with tin occurs at the decomposition temperature of 720° C, so that no $Nb_3Sn$ layer is formed there. These and other modifications may be made without departing from the spirit of the invention which is intended to be limited solely by the appended claims.

We claim:

1. A method for the manufacture of a superconductor with a superconducting intermetallic compound consisting of at least two chemical elements comprising:
   a. bringing a ductile structural part made of at least one element of the compound into contact with a second structural part containing a ductile carrier metal for the remaining elements of the compound;
   b. subsequently supplying the remaining elements of the compound to the second ductile structural part at elevated temperature;
   c. diffusing said remaining elements through said second structural part and reacting said remaining elements with the element in said first structural part to form said compound; and
   d. wherein the improvement comprises said step of supplying comprising supplying the remaining elements to the second structural part through decomposition of alkyl compounds of said remaining elements.

2. The method according to claim 1 and further including: (a) embedding several cores of the one element in a matrix material containing said ductile carrier metal; (b) reducing the cross section of the matrix and cores; and (c) after the last cross section-reducing process step, heating the conductor structure so obtained and bringing it into contact with the alkyl compounds of the remaining elements.

3. The method according to claim 1 wherein the superconductive compound to be manufactured is a compound, consisting of two elements, of the type $A_3B$ with A-15 crystal structure and the first structural part consists of the higher melting point element of the compound, with the lower melting point element supplied through the decomposition of an alkyl compound.

4. The method according to claim 1 wherein the second structural part also contains a share of the remaining elements of the compound to be manufactured.

5. The method according to claim 4 wherein the share of the remaining elements of the second structural part is at least high enough that the electric resistance of the second structural is increased by at least a factor 100 over the pure carrier metal and wherein said conductor structure is heated for the purpose of decomposing the alkyl compounds by the direct passage of current.

6. The method according to claim 5 wherein the second structural part contains no more of the remaining elements than will permit cold working without intermediate annealing.

7. The method according to claim 1 wherein the compound $Nb_3Sn$ is formed.

8. The method according to claim 5 wherein the first structural part consists of niobium and the second structural part is of a copper-tin alloy with about 1 to 4 atom-percent of tin.

9. The method according to claim 8 wherein tin tetraethyl is used as the alkyl compound and the conductor structure is heated for the purpose of decomposing the tin tetraethyl to a temperature of about 650 to 800°C.

10. The method according to claim 1 and further including performing an additional heat treatment in an inert atmosphere to form the intermetallic compound after the remaining elements are supplied through decomposition of the alkyl compounds.

11. The method according to claim 10 wherein the heat treatment is performed at a temperature of between about 740 and 850° C for at least 10 hours.

12. A method for the manufacture of a superconductor having a superconducting intermetallic compound consisting of at least two chemical elements comprising:
   a. bringing a ductile first member made of at least one element of the compound into contact with a second member containing a ductile carrier metal for the remaining elements of th compound to form a starting structure;
   b. disposing said starting structure within a reaction vessel;
   c. supplying to said vessel an alkyl compound of the remaining elements of the compound;
   d. heating said starting structure to a temperature at which said alkyl compound is decomposed whereby said remaining elements will be deposited on said second member and will diffuse through said second member whereafter they will react with said one element of said first member to form said intermetallic compound.

* * * * *